(12) United States Patent
Choi

(10) Patent No.: US 7,898,897 B2
(45) Date of Patent: Mar. 1, 2011

(54) CIRCUIT AND METHOD FOR GENERATING WORD LINE OFF VOLTAGE

(75) Inventor: Jun-Gi Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 146 days.

(21) Appl. No.: 12/327,588

(22) Filed: Dec. 3, 2008

(65) Prior Publication Data

US 2009/0323438 A1 Dec. 31, 2009

(30) Foreign Application Priority Data

Jun. 30, 2008 (KR) .................. 10-2008-0063166

(51) Int. Cl.
*G11C 11/00* (2006.01)
(52) U.S. Cl. .................. 365/230.06; 365/189.05
(58) Field of Classification Search ............ 365/230.06, 365/189.05
See application file for complete search history.

(56) References Cited

U.S. PATENT DOCUMENTS

| 6,016,281 | A * | 1/2000 | Brox .................. 365/230.06 |
| 6,236,617 | B1 | 5/2001 | Hsu et al. |
| 6,337,595 | B1 | 1/2002 | Hsu et al. |
| 6,477,076 | B2 | 11/2002 | Kim et al. |
| 6,639,836 | B1 | 10/2003 | Hung et al. |
| 7,009,904 | B2 | 3/2006 | Kim |
| 7,085,191 | B2 | 8/2006 | Rehm et al. |
| 7,142,446 | B2 | 11/2006 | Derner et al. |
| 7,245,548 | B2 | 7/2007 | Derner et al. |
| 7,274,618 | B2 | 9/2007 | Leung |
| 7,307,896 | B2 | 12/2007 | Doyle et al. |

FOREIGN PATENT DOCUMENTS

| JP | 2002-056671 | 2/2002 |
| JP | 2004-055092 | 2/2004 |
| JP | 2004-342258 | 12/2004 |
| KR | 1019990063148 A | 7/1999 |
| KR | 10650768 B1 | 11/2006 |
| KR | 100650768 B1 | 11/2006 |
| KR | 2007-019066 | 2/2007 |

OTHER PUBLICATIONS

Notice of Allowance issued from Korean Intellectual Property Office on Nov. 27, 2009.
Notice of Preliminary Rejection issued from Korean Intellectual Property Office on Jun. 29, 2009 with an English Translation.

* cited by examiner

*Primary Examiner*—Michael T Tran
(74) *Attorney, Agent, or Firm*—IP & T Group LLP

(57) ABSTRACT

A circuit and method for generating a word line off voltage which can minimize a leakage current by actively adjusting a level of the word line off voltage. The circuit includes a current information provider for providing information about an amount of current flowing through a cell transistor, and a voltage generator for generating a word line off voltage with a varying level depending on the information.

13 Claims, 5 Drawing Sheets

CIRCUIT AND METHOD FOR GENERATING WORD LINE OFF VOLTAGE

CROSS-REFERENCE TO RELATED APPLICATION

The present invention claims priority of Korean patent application number 10-2008-0063166, filed on Jun. 30, 2008, which is incorporated by reference in its entirety.

BACKGROUND OF THE INVENTION

The present invention relates to a semiconductor memory device, and more particularly, to a technology of generating a word line off voltage to minimize a leakage current of a cell transistor.

FIG. 1 is a circuit diagram showing a memory cell of a conventional semiconductor memory device. As shown in the drawing, a memory cell in a memory device includes a capacitor C for storing data and a cell transistor T for controlling charge sharing between the capacitor C and a bit line BL under the control of a word line WL.

Ideally, when the word line WL is enabled, the cell transistor T should be completely turned on, whereas when the word line WL is disabled, the cell transistor T should be completely turned off, thereby completely separating the capacitor C from the bit line BL electrically. However, the transistor cannot be completely turned on/off due to its characteristics. Therefore, when the word line WL is enabled, a higher voltage VPP than a power supply voltage VDD is applied to the transistor T so that it is turned on more completely.

On the other hand, when the word line WL is disabled, a lower word line off voltage VBBW than a ground voltage VSS is inputted to the transistor T so that it is turned off more completely. This is because, when the cell transistor T is turned off, an amount of leakage current should be decreased to improve refresh characteristics of the memory device.

FIG. 2 is shows details of the cell transistor T in FIG. 1. Referring to the drawing, a word line WL is disabled and a word line off voltage VBBW is applied to a gate of the cell transistor T. And, 'high' data is stored in a capacitor C and a core voltage VCORE is inputted to a drain VD of the cell transistor. Also, the bit line BL is precharged and a half core voltage VCORE/2 is applied to a source of the cell transistor. Furthermore, a negative voltage VBB is applied to a back bias of the cell transistor.

In this state, it is most ideal that the cell transistor T is turned off to let no current flow therethrough, but a little current actually flows through the cell transistor T. At this time, current flowing through the cell transistor includes an off current I_OFF and a leakage current I_LEAK. The off current I_OFF refers to current flowing from drain to source and the leakage current I_LEAK stands for a junction leakage current.

In order to enhance refresh characteristics of a memory device, namely to prevent data leakage, a sum of an off current I_OFF and a leakage current I_LEAK that flow when the word line is disabled has to be minimized. For this minimization, a level of the word line off voltage VBBW needs to be properly adjusted.

FIG. 3 is a graph showing that an off current I_OFF and a leakage current I_LEAK vary as a word line off voltage VBBW varies. Referring to the drawing, it has the following performance characteristics. That is, as the word line off voltage VBBW decreases (in other words, as a negative absolute value increases), the off current decreases but the leakage current rather increases.

Meanwhile, data leakage occurs, which corresponds to a total current I_TOTAL that is a sum of the off current I_OFF and the leakage current I_LEAK. Therefore, in order to reduce such data leakage, the word line off voltage VBBW that minimizes an amount of total current I_TOTAL needs to be used.

FIG. 4 is a circuit diagram showing a typical circuit for generating a word line off voltage VBB. The typical word line off voltage generation circuit generates a word line off voltage VBBW from a negative voltage VBB. The negative voltage VBB refers to a lower voltage than a ground voltage VSS, which is resulted from a pumping operation in a negative voltage pumping circuit. In general, the negative voltage VBB has a lower level than the word line off voltage VBBW.

In FIG. 4, resistors R1 and R2 are used for voltage division of a core voltage VCORE and a word line off voltage VBBW to generate a first voltage VHALF1, and resistors R3 and R4 are used for voltage division of the core voltage VCORE and a ground voltage VSS to produce a second voltage VHALF2.

The first voltage VHALF1 and the second voltage VHALF2 so generated are then applied to an operational amplifier 401, which controls a turning-on operation of a transistor N1 with its output voltage DET. As a result, the word line off voltage VBBW with a certain difference from the negative voltage VBB, i.e., with a higher level than the negative voltage is generated.

Meanwhile, a resistance ratio of the resistors R1 to R4 and a turning-on voltage of the transistor N1 can be properly adjusted based on a level of the negative voltage VBB and a level of the word line off voltage VBBW to be generated. Currently, when the negative voltage VBB level is −0.8 V, the resistance ratio and the turning-on voltage of the transistor are adjusted so that the word line off voltage VBBW level can be about −0.3 V.

As described above, the conventional word line off voltage generating circuit generates a word line off voltage VBBW with a particular value. Therefore, if an optimized word line off voltage VBBW level varies due to variations in Process, Voltage and Temperature (PVT) conditions within a memory device chip, such word line off voltage VBBW level may not vary accordingly.

SUMMARY OF THE INVENTION

Embodiments of the present invention are directed to providing a circuit for generating a word line off voltage which can minimize a leakage current by actively adjusting a level of the word line off voltage.

In accordance with an aspect of the invention, there is provided a circuit for generating a word line off voltage, which includes: a current information provider for providing information about an amount of current flowing through a cell transistor; and a voltage generator for generating a word line off voltage with a varying level depending on the current information.

In accordance with another aspect of the invention, there is provided a circuit for generating a word line off voltage, which includes: one or more replica transistors, with the same performance characteristics as a cell transistor, for providing a core voltage in response to a word line off voltage; and a voltage generator for generating the word line off voltage with a varying level depending on a sum of current flowing through the one or more replica transistors.

Thus, the word line off voltage generating circuit of the invention can actively vary a word line off voltage to an optimal level according to the variation of the amount of current flowing through a cell transistor.

In accordance with another aspect of the invention, there is provided a method for generating a word line off voltage, which includes: generating information associated with or indicative of an amount of current flowing through a cell transistor; and generating a word line off voltage with a varying level depending on the current information.

DESCRIPTION OF SPECIFIC EMBODIMENTS

Hereinafter, preferred embodiments of the present invention will be described in detail with reference to the accompanying drawings so that the invention can be easily practiced by those skilled in the art.

Figure 1:
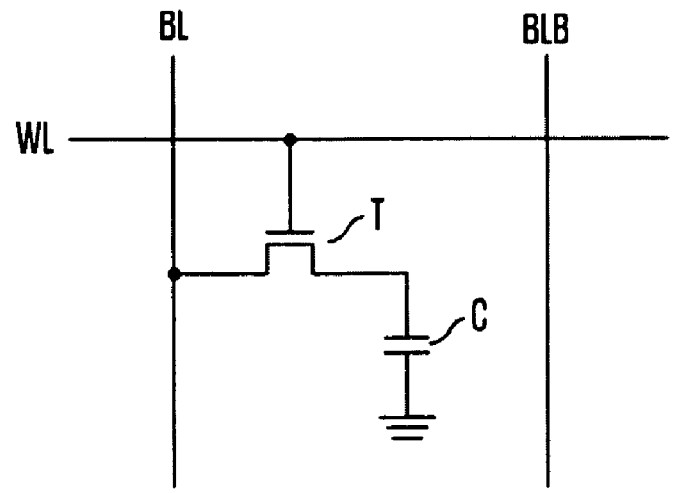
FIG. 1 is a circuit diagram showing a memory cell of a conventional semiconductor memory device.
Figure 2:
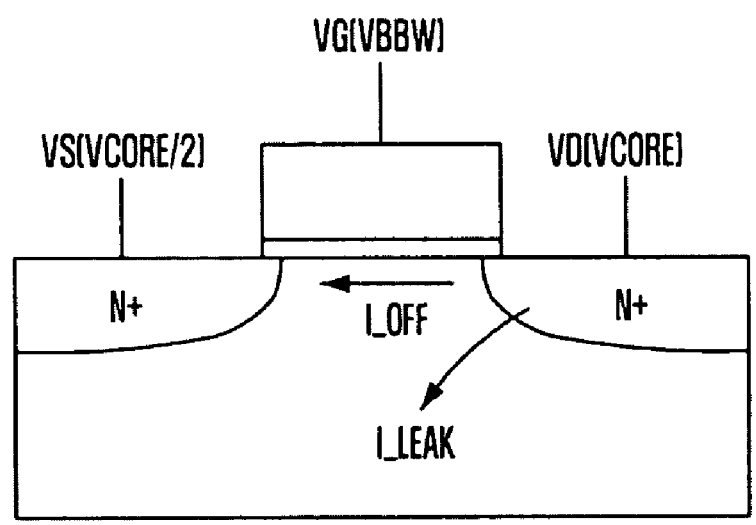
FIG. 2 is a diagram showing details of the cell transistor T of FIG. 1.
Figure 3:
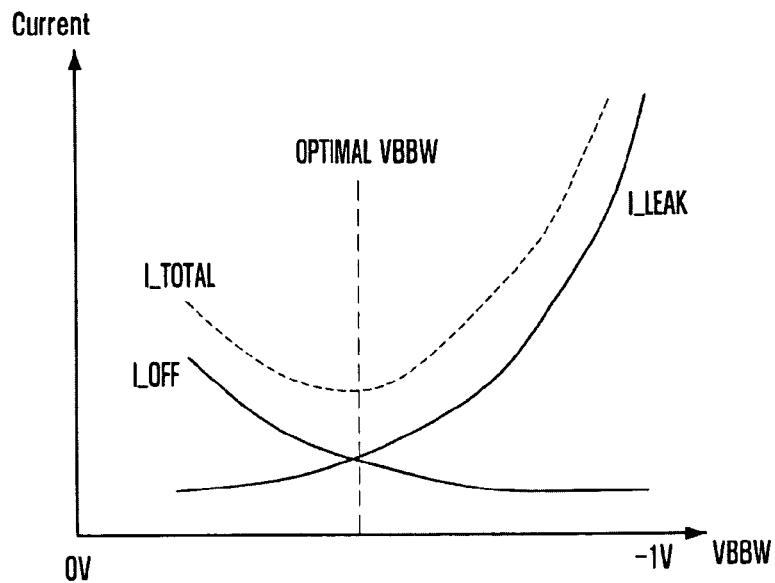
FIG. 3 is a graph showing that an off current I_OFF and a leakage current I_LEAK vary as the word line off voltage VBBW varies.
Figure 4:
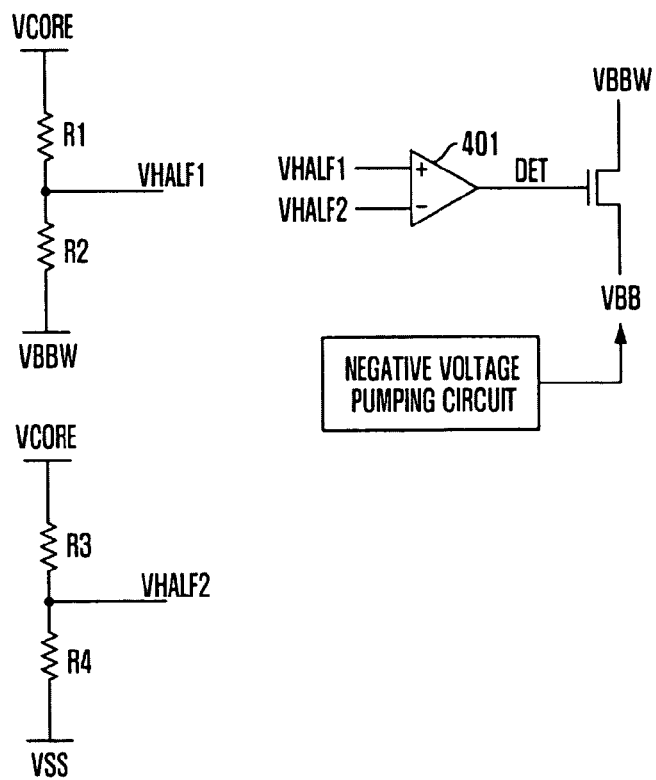
FIG. 4 is a circuit diagram showing a conventional circuit for generating a word line off voltage VBB.
Figure 5:
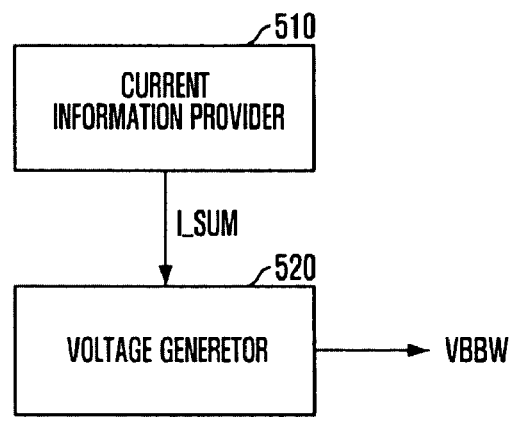
FIG. 5 is a block diagram illustrating a circuit for generating a word line off voltage in accordance with an embodiment of the present invention.

FIG. 5 is a block diagram illustrating a circuit for generating a word line off voltage in accordance with one embodiment of the invention.

As shown in the drawing, the circuit for generating a word line off voltage in accordance with the invention includes a current information provider 510 and a voltage generator 520.

The current information provider 510 outputs information I_SUM associated with an amount of current that now flows through a cell transistor. The voltage generator 520 generates a word line off voltage VBBW with a varying level depending on the current information I_SUM.

As a result, a level of the word line off voltage VBBW varies depending on an amount of current flowing through the cell transistor. Therefore, although there may be variation in PVT conditions, the word line off voltage VBBW can be always kept at an optimal voltage level to minimize a total current I_TOTAL.

Figure 6:
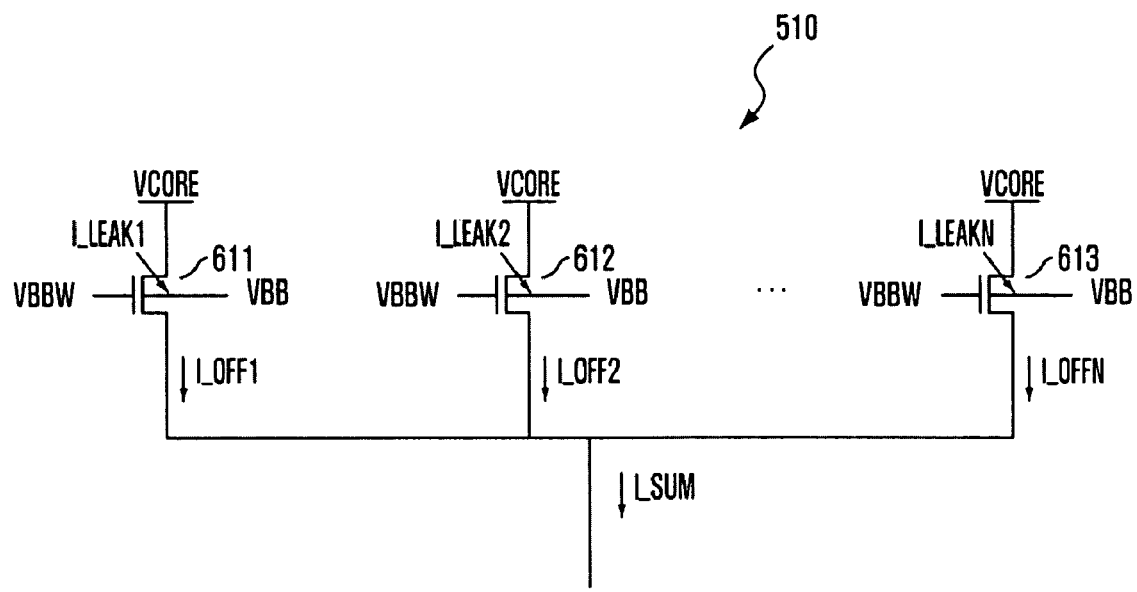
FIG. 6 is a detailed circuit diagram of the current information provider 510 shown in FIG. 5.

FIG. 6 is a detailed circuit diagram of the current information provider 510 shown in FIG. 5.

The current information provider 510 includes one or more replica transistors 611 to 613 having the same performance characteristics as the cell transistor. Since only a very small amount of current flows through one replica transistor, e.g., 611, the current information provider 510 preferably includes the one or more replica transistors 611 to 613 to provide more accurate current information I_SUM. The replica transistors 611 to 613 are arranged to detect a variation in an amount of current that flows through the cell transistor. Therefore, it is preferable that those replica transistors possess the same performance characteristics as the cell transistor.

The same voltage as that being applied when the cell transistor is turned off should be applied to the replica transistors 611 to 613 so that the same amount of current as the cell transistor can flow through them. Therefore, the core voltage VCORE is applied to drains of the replica transistors 611 to 613, while the word line off voltage VBBW is inputted to gates thereof.

Meanwhile, a sum of currents I_OFF1, I_OFF2, . . . , I-OFFN flowing through the drains of the replica transistors 611 to 613 is provided as current information (I_SUM). Since the current flowing through the drains is an off current I_OFF, the current information I_SUM indicates information on what is an amount of off current I_OFF of the cell transistor at present.

Figure 7:
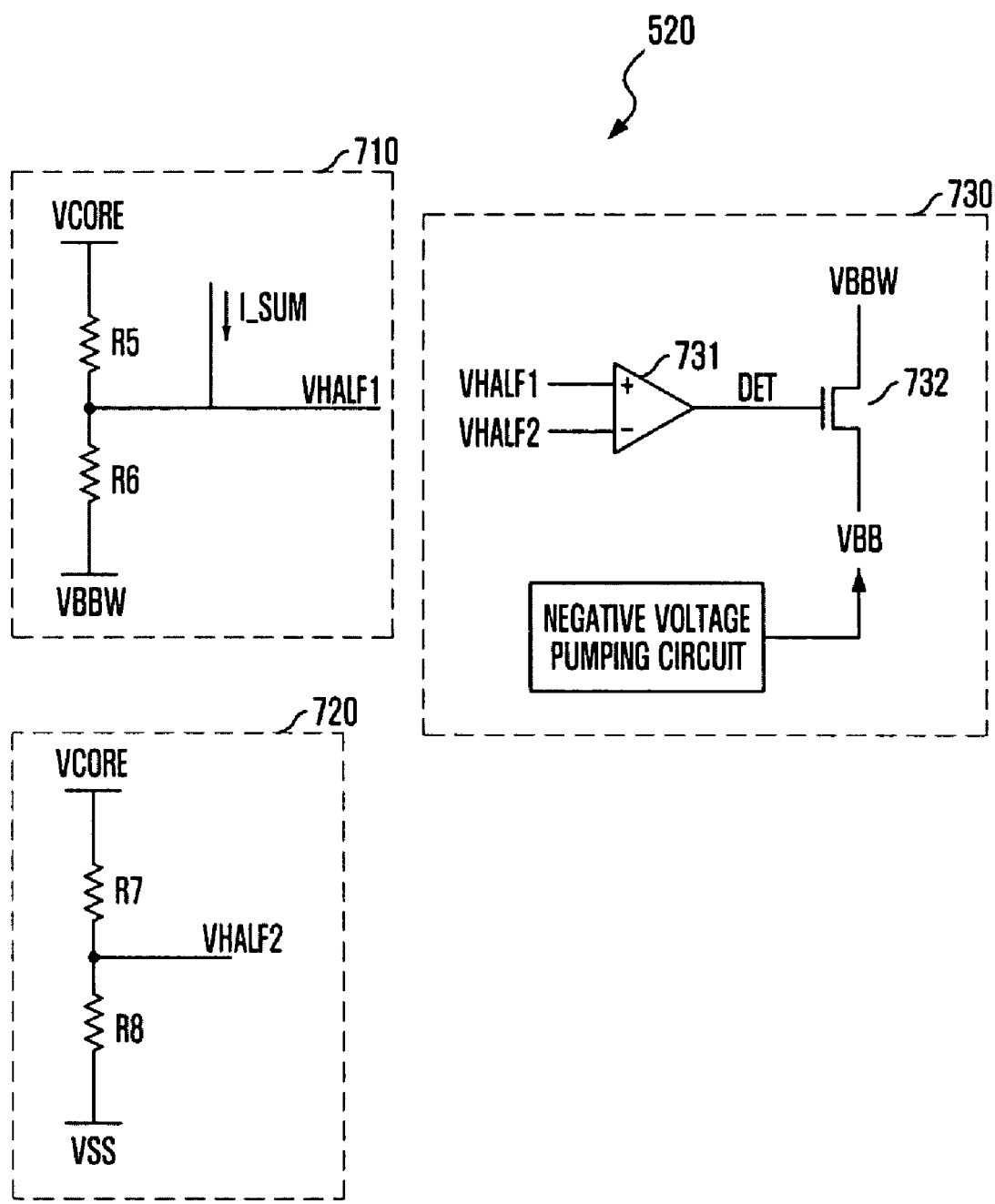
FIG. 7 is a detailed circuit diagram of the voltage generator 520 shown in FIG. 5.

FIG. 7 is a detailed circuit diagram of the voltage generator 520 shown in FIG. 5.

The voltage generator 520 generates a word line off voltage VBBW with a varying level depending on the current information I_SUM.

For example, if the current information I_SUM indicates that the off current I_OFF has increased, the voltage generator 520 lowers a level of the word line off voltage VBBW, that is, raises a negative absolute value. The increase in the off current I_OFF means that the level of the word line off voltage VBBW is not sufficiently low.

On the contrary, if the current information I_SUM indicates that the off current I_OFF has decreased, the voltage generator 520 raises a level of the word line off voltage VBBW, that is, lowers a negative absolute value. The decrease in the off current I_OFF means that the leakage current I_LEAK has increased, which indicates that the level of the word line off voltage VBBW is too low.

That is, when the off current I_OFF increases, the voltage generator 520 lowers a level of the word line off voltage VBBW, whereas when the off current I_OFF decreases, the voltage generator 520 raises a level of the word line off voltage VBBW, so that the word line off voltage VBBW can be always kept at an optimal level.

This voltage generator 520 is provided with a first voltage generator 710 for generating as a first voltage VHALF1 a sum of a voltage obtained by voltage division of the core voltage VCORE and the word line off voltage VBBW and current in the current information I-SUM, a second voltage generator 720 for generating a second voltage VHALF2 by voltage division of the core voltage VCORE and a ground voltage VSS, and an off voltage generator 730 for producing the word line off voltage VBBW based on the first voltage VHALF1 and the second voltage VHALF2. The off voltage generator 730 includes an operational amplifier 731 for receiving the first voltage VHALF1 and the second voltage VHALF2, and a transistor 732 for taking an output DET from the operational amplifier 731 via its gate and driving the word line off voltage VBBW from a negative voltage VBB.

Figure 8:
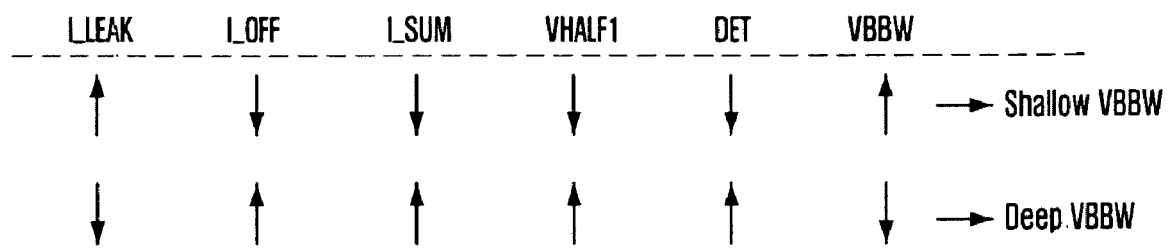
FIG. 8 is a diagram simply describing an overall operation of the current information provider 510 and the voltage generator 520.

FIG. 8 is a diagram simply describing an overall operation of the current information provider 510 and the voltage generator 520. With reference to FIG. 8, the overall operation of the invention will be described below.

First, referring to the upper side of the drawing, when the word line off voltage VBBW is lower than an optimal level, an amount of leakage current increases (I_LEAK↑) and an amount of off current decreases (I_OFF↓). Thus, an amount of current in the current information also decreases (I_SUM↓). Then, a level of the first voltage drops (VHALF1↓) so that a level of an output voltage of the operational amplifier 731 also drops (DET↓). Accordingly, the transistor 732 is weakly turned on to have an increased voltage difference between the negative voltage VBB and the word line off voltage VBBW, thereby making a level of the word line off voltage risen (VBBW↑, shallow VBBW).

Next, referring to the lower side of the drawing, when the word line off voltage VBBW is higher than an optimal level, an amount of leakage current decreases (I_LEAK↓) and an amount of off current increases (I_OFF↑). Thus, an amount of current in the current information also increases (I_SUM↑). Then, a level of the first voltage rises (VHALF1↑) so that a level of an output voltage of the operational amplifier 731 also rises (DET↑). Accordingly, the transistor 732 is strongly turned on to have a decreased voltage difference between the negative voltage VBB and the word line off voltage VBBW, thereby making a level of the word line off voltage dropped (VBBW↓, deep VBBW).

Now, a method for generating a word line off voltage in accordance with the invention will be described in detail with reference to FIGS. 5 to 8.

The method for generating a word line off voltage in accordance with the invention includes generating current information I_SUM associated with an amount of current flowing through a cell transistor, and generating a word line off voltage VBBW with a varying level depending on the current information I_SUM.

In this method, generating current information includes applying the word line off voltage VBBW to the replica transistors 611 to 613 having the same performance characteristics as the cell transistor, and providing an amount of current flowing through the replica transistors 611 to 613 as the current information I_SUM.

Also, generating a word line off voltage includes generating a first voltage VHALF1 varying depending on the current information I_SUM, generating a second voltage VHALF2 by voltage division of the core voltage VCORE and the ground voltage VSS, and driving the word line off voltage VBBW from a negative voltage VBB based on the first voltage VHALF1 and the second voltage VHALF2.

As described above, the circuit for generating a word line off voltage in accordance with the invention monitors an amount of current flowing through a cell transistor and varies a level of the word line off voltage based on the monitored amount of current. Thus, even though there is a variation in PVT conditions, etc. within a chip, a level of the word line off voltage can be always kept at an optimal level.

Moreover, by always keeping a level of the word line off voltage at an optimal level, loss of data in the cell transistor is reduced, thereby improving refresh characteristics of a memory device.

While the invention has been described with respect to the specific embodiments, it will be apparent to those skilled in the art that various changes and modifications may be made without departing from the spirit and scope of the invention as defined in the following claims.

What is claimed is:

1. A circuit for generating a word line off voltage, comprising a current information providing unit for providing information about an amount of current flowing through a cell transistor, and a voltage generator for generating a word line off voltage with a varying level depending on the information,
wherein the current information providing unit includes one or more replica transistors having the same performance characteristics as the cell transistor,
wherein the current information providing unit provides a current flowing through one or more replica transistors, the amount of the current flowing through the one or more replica transistors representing the information.

2. The circuit as recited in claim 1, wherein the one or more replica transistors receive the word line off voltage via their gates.

3. The circuit as recited in claim 2, wherein the one or more replica transistors receive a core voltage via their drains.

4. The circuit as recited in claim 1, wherein the voltage generator raises a level of the word line off voltage when the amount of current flowing through the cell transistor decreases, and lowers a level of the word line off voltage when the amount of current flowing through the cell transistor increases.

5. The circuit as recited in claim 1, wherein the voltage generator adjusts a potential difference between a negative voltage and the word line off voltage in response to the information.

6. A circuit for generating a word line off voltage, including one or more replica transistors having the same performance characteristics as a cell transistor, for providing a core voltage in response to a word line off voltage; and a voltage generator for generating the word line off voltage with a varying level depending on the total amount of current flowing through the one or more replica transistors,
wherein the total amount of current flowing through the one or more replica transistors is a sum of current flowing through the sources of the one or more replica transistors.

7. The circuit as recited in claim 6 wherein the voltage generator determines a voltage difference between a negative voltage and the word line off voltage according to the sum of current flowing through the one or more replica transistors.

8. The circuit as recited in claim 6, wherein the voltage generator includes
a first voltage generator for generating as a first voltage a sum of a voltage obtained by voltage division of the core voltage and the word line off voltage and a voltage determined by the current flowing through the sources,
a second voltage generator for generating a second voltage by voltage division of the core voltage and a ground voltage, and
an off voltage generator for producing the word line off voltage based on the first voltage and the second voltage.

9. The circuit as recited in claim 8, wherein the off voltage generator includes an operational amplifier receiving the first voltage and the second voltage, and a transistor configured to take an output from the operational amplifier via its gate and drive the word line off voltage from the negative voltage.

10. A method for generating a word line off voltage, comprising generating information indication ofindicating an amount of current flowing through a cell transistor, and generating a word line off voltage with a varying level depending on the information,
wherein the generating information includes applying the word line off voltage to replica transistors having the same performance characteristics as a cell transistor, and providing the amount of current flowing through the replica transistors as the information.

11. The method as recited in claim 10, wherein the amount of current flowing through each of the replica transistors is equal to an amount of current flowing through each of sources of the replica transistors.

12. The method as recited in claim 10, wherein the generating a word line off voltage is performed by adjusting a potential difference between a negative voltage and the word line off voltage in response to the information.

13. The method as recited in claim 10, wherein the generating a word line off voltage includes generating a first voltage that varies depending on the information, generating a second voltage by voltage division of the core voltage and a ground voltage, and driving the word line off voltage from a negative voltage based on the first voltage and the second voltage.

* * * * *